United States Patent
Otsuji

(10) Patent No.: US 10,549,322 B2
(45) Date of Patent: Feb. 4, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventor: Masayuki Otsuji, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 213 days.

(21) Appl. No.: 15/558,042

(22) PCT Filed: Mar. 16, 2016

(86) PCT No.: PCT/JP2016/058288
§ 371 (c)(1),
(2) Date: Sep. 13, 2017

(87) PCT Pub. No.: WO2016/158410
PCT Pub. Date: Oct. 6, 2016

(65) Prior Publication Data
US 2018/0068876 A1  Mar. 8, 2018

(30) Foreign Application Priority Data
Mar. 27, 2015 (JP) .................................. 2015-065995

(51) Int. Cl.
*B08B 3/02* (2006.01)
*B08B 3/10* (2006.01)
(Continued)

(52) U.S. Cl.
CPC .............. *B08B 3/024* (2013.01); *B08B 3/106* (2013.01); *H01L 21/02057* (2013.01);
(Continued)

(58) Field of Classification Search
CPC combination set(s) only.
See application file for complete search history.

(56) References Cited

U.S. PATENT DOCUMENTS

2008/0142054 A1* 6/2008 Eitoku .............. H01L 21/67051
134/30
2008/0190454 A1  8/2008 Eitoku ........................... 134/19
(Continued)

FOREIGN PATENT DOCUMENTS

JP  2001-246337 A  9/2001
JP  2003-297794 A  10/2003
(Continued)

OTHER PUBLICATIONS

International Search Report dated Jun. 7, 2016 in corresponding PCT International Application No. PCT/JP2016/058288.
(Continued)

*Primary Examiner* — Erin F Bergner
(74) *Attorney, Agent, or Firm* — Ostrolenk Faber LLP

(57) ABSTRACT

A second liquid film of the second processing liquid covers an upper surface of the first liquid film of the first processing liquid, on the upper surface of the substrate. In the substrate processing apparatus, extraneous matters on the upper surface of the substrate are removed from the upper surface of the substrate and moved toward the inside of the second liquid film by the first processing liquid which is vaporized between the second liquid film and the substrate by performing heating of the first liquid film at a temperature not lower than the boiling point of the first processing liquid and lower than the boiling point of the second processing liquid. It is thereby possible to suitably remove the extraneous matters from the substrate while suppressing any damage on the upper surface of the substrate.

9 Claims, 5 Drawing Sheets

(51) Int. Cl.
*H01L 21/02* (2006.01)
*H01L 21/67* (2006.01)
*H01L 21/673* (2006.01)
*H01L 21/687* (2006.01)

(52) U.S. Cl.
CPC ...... *H01L 21/6708* (2013.01); *H01L 21/6732* (2013.01); *H01L 21/67034* (2013.01); *H01L 21/67051* (2013.01); *H01L 21/68764* (2013.01)

(56) References Cited

U.S. PATENT DOCUMENTS

| | | | |
|---|---|---|---|
| 2008/0230101 A1 | 9/2008 | Hayashi | 134/57 |
| 2010/0206337 A1 | 8/2010 | Hiroshiro et al. | 134/26 |
| 2011/0155177 A1 | 6/2011 | Tamura et al. | 134/18 |
| 2012/0160274 A1 | 6/2012 | Kasai et al. | 134/26 |
| 2012/0175819 A1 | 7/2012 | Miya et al. | 264/334 |
| 2012/0260947 A1 | 10/2012 | Kaneko | 134/19 |
| 2014/0093644 A1 | 4/2014 | Fujii | 427/240 |

FOREIGN PATENT DOCUMENTS

| | | |
|---|---|---|
| JP | 2006-181426 A | 7/2006 |
| JP | 2010-056534 A | 3/2010 |
| JP | 2010-186901 A | 8/2010 |
| JP | 2010-238918 A | 10/2010 |
| JP | 2011-077144 A | 4/2011 |
| JP | 2011-121009 A | 6/2011 |
| KR | 10-2008-008614 A | 9/2008 |
| KR | 10-2012-0116361 A | 10/2012 |
| TW | 200847249 A | 12/2008 |
| TW | 201230177 A1 | 7/2012 |
| TW | 201234454 A1 | 8/2012 |
| WO | WO 2009/019987 A1 | 2/2009 |

OTHER PUBLICATIONS

Written Opinion dated Jun. 7, 2016 in corresponding PCT International Application No. PCT/JP2016/058288.
PCT/IB/326 Notification Concerning Transmitaal of International Preliminary Report on Patentability including PCT/IB/373 and PCT/ISA/237 (in Japanese) dated Oct. 12, 2017 for International Application No. PCT/JP2016/058288.
PCT/IB/338 Notification of Transmittal of Translation of the International Preliminary Report on Patentability including PCT/IB/373 and PCT/ISA/237 (in English) dated Oct. 12, 2017 for International Application No. PCT/JP2016/058288.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2016/058288, filed Mar. 16, 2016, which claims priority to Japanese Patent Application No. 2015-065995, filed Mar. 27, 2015, the contents of both of which are incorporated herein by reference. The PCT International Application was published in the Japanese language.

TECHNICAL FIELD

The present invention relates to a substrate processing apparatus and a substrate processing method for processing a substrate.

BACKGROUND ART

In a process of manufacturing a semiconductor substrate (hereinafter, referred to simply as a "substrate"), conventionally, various processings are performed by supplying a processing liquid onto a substrate. For example, performed is a cleaning process for washing out extraneous matters deposited on a surface of the substrate by supplying a cleaning solution onto the substrate.

In a substrate cleaning method disclosed in Japanese Patent Application Laid-Open No. 2010-56534 (Document 1), after a substrate having a surface on which a pattern is formed is heated to 140 to 300° C., droplets of a cleaning solution are supplied onto the surface of the substrate. Since the Leidenfrost phenomenon in which a vapor of the cleaning solution is interposed between the droplets of the cleaning solution and the substrate occurs on the substrate, the droplets of the cleaning solution do not enter between the patterns, being floating slightly above the substrate. Then, by the vapor sprayed from a lower surface side of the droplets of the cleaning solution onto the surface of the substrate, deposits such as residues or the like on the substrate are raised upward and removed. In the substrate cleaning method, since the cleaning solution does not enter between the patterns, it is possible to perform cleaning of the substrate while suppressing collapse of the patterns on the surface of the substrate.

On the other hand, in a substrate processing apparatus disclosed in Japanese Patent Application Laid-Open No. 2011-121009 (Document 2), a liquid film of a HFE liquid is formed on a surface of a substrate, and a liquid film of deionized water (DIW) on the liquid film of the HFE liquid. Then, by applying ultrasonic vibration to the liquid film of deionized water, a shock wave is applied onto the surface of the substrate and the surface of the substrate is thereby cleaned. In the substrate processing apparatus, since part of the shock wave caused by the ultrasonic vibration is reflected on an interface between the two kinds of liquid films, the energy of the shock wave to be applied onto the surface of the substrate decreases and the damage to the substrate is reduced.

Further, in a substrate processing apparatus disclosed in Japanese Patent Application Laid-Open No. 2010-238918 (Document 3), a processing of a substrate is performed by immersing the substrate with its main surface facing the side into a processing liquid pooled in a processing bath. When the processing is finished and the substrate is taken out upward from the processing liquid, part of the substrate which is positioned below a liquid surface of the processing liquid is heated to a temperature not lower than the boiling point of the processing liquid. Since the processing liquid between fine patterns on the main surface of the substrate is thereby vaporized, the surface tension of the processing liquid acting on the fine patterns decreases when the substrate passes through the liquid surface of the processing liquid, and it is possible to prevent the collapse of the fine patterns due to the surface tension.

In the substrate cleaning method disclosed in Document 1, there is a possibility that the deposits raised by the vapor from the droplets of the processing liquid may be diffused upward from the surroundings of the droplets and may fall onto the surface of the substrate to be deposited thereon again.

SUMMARY OF INVENTION

The present invention is intended for a substrate processing apparatus, and it is an object of the present invention to suitably remove extraneous matters from a substrate while suppressing any damage on an upper surface of the substrate. The present invention is also intended for a substrate processing method.

The substrate processing apparatus according to the present invention includes a substrate holding part for holding a substrate in a horizontal state and a processing liquid supply part for supplying a first processing liquid onto an upper surface of the substrate and a second processing liquid having a specific gravity lower than that of the first processing liquid and a boiling point higher than that of the first processing liquid and for forming a first liquid film which is a liquid film of the first processing liquid and a second liquid film which is a liquid film of the second processing liquid and covers an upper surface of the first liquid film, on the upper surface of the substrate, and in the substrate processing apparatus of the present invention, extraneous matters on the upper surface of the substrate are removed from the upper surface of the substrate and moved toward the inside of the second liquid film by the first processing liquid which is vaporized between the second liquid film and the substrate by performing heating of the first liquid film at a temperature not lower than the boiling point of the first processing liquid and lower than the boiling point of the second processing liquid. By the substrate processing apparatus of the present invention, it is possible to suitably remove the extraneous matters from the substrate while suppressing any damage on the upper surface of the substrate.

In one preferred embodiment of the present invention, the substrate processing apparatus further includes a substrate rotating mechanism for rotating the substrate together with the substrate holding part about a central axis directed in a vertical direction, to thereby remove the second liquid film from the upper surface of the substrate.

In another preferred embodiment of the present invention, the processing liquid supply part continuously supplies the second processing liquid to the second liquid film in parallel with vaporization of the first processing liquid.

In still another preferred embodiment of the present invention, the processing liquid supply part continuously supplies the first processing liquid to the first liquid film in parallel with vaporization of the first processing liquid.

In yet another preferred embodiment of the present invention, the substrate processing apparatus further includes a heating part for performing the heating of the first liquid film by heating the substrate from a lower surface side.

In a further preferred embodiment of the present invention, the heating of the first liquid film is performed by the second processing liquid supplied onto the substrate from the processing liquid supply part at a temperature higher than the boiling point of the first processing liquid and lower than the boiling point of the second processing liquid.

In a still further preferred embodiment of the present invention, the processing liquid supply part includes a first nozzle for discharging the first processing liquid toward the upper surface of the substrate and a second nozzle for discharging the second processing liquid toward the upper surface of the substrate, and a tip of the first nozzle is positioned between the upper surface of the substrate and an upper surface of the second liquid film in a state where the second liquid film is formed.

In a yet further preferred embodiment of the present invention, the first liquid film entirely covers the upper surface of the substrate, and the second liquid film entirely covers the upper surface of the first liquid film.

In a further preferred embodiment of the present invention, the first processing liquid is hydrofluoroether and the second processing liquid is deionized water.

In a still further preferred embodiment of the present invention, the first processing liquid is hydrofluoroether and the second processing liquid is isopropyl alcohol.

These and other objects, features, aspects and advantages of the present invention will become more apparent from the following detailed description of the present invention when taken in conjunction with the accompanying drawings.

DESCRIPTION OF EMBODIMENTS

Figure 1:
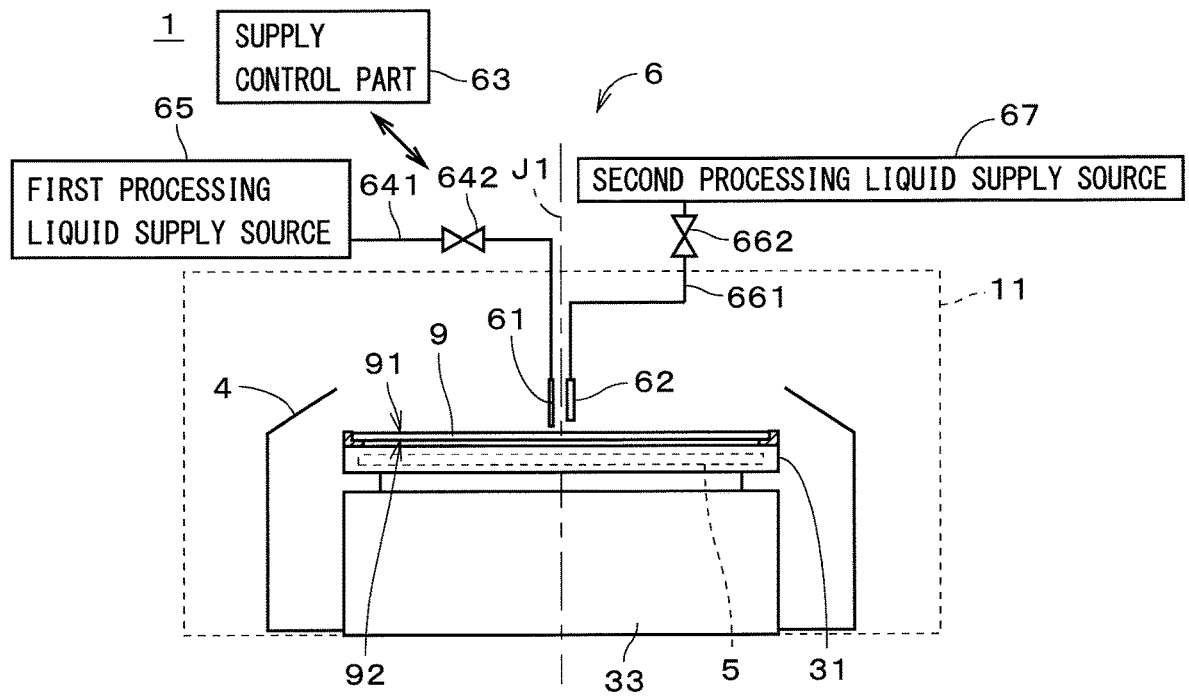
FIG. 1 is a view showing a configuration of a substrate processing apparatus in accordance with a first preferred embodiment.

FIG. 1 is a view showing a configuration of a substrate processing apparatus 1 in accordance with the first preferred embodiment of the present invention. The substrate processing apparatus 1 is a single-substrate processing apparatus for processing semiconductor substrates 9 (hereinafter, referred to simply as "substrates 9") one by one. The substrate processing apparatus 1 supplies a processing liquid to the substrate 9, to thereby perform a cleaning process. FIG. 1 shows part of the configuration of the substrate processing apparatus 1 in a cross section.

The substrate processing apparatus 1 includes a housing 11, a substrate holding part 31, a substrate rotating mechanism 33, a cup part 4, a heating part 5, and a processing liquid supply part 6. The housing 11 accommodates the substrate holding part 31, the cup part 4, and the like. In FIG. 1, the housing 11 is indicated by a broken line.

The substrate holding part 31 is a substantially disk-like member around a central axis J1 directed in a vertical direction. The substrate 9 is disposed above the substrate holding part 31, with its upper surface 91 facing upward. On the upper surface 91 of the substrate 9, for example, a fine projection-depression pattern is formed in advance. The substrate holding part 31 holds the substrate 9 in a horizontal state. The substrate rotating mechanism 33 is disposed below the substrate holding part 31. The substrate rotating mechanism 33 rotates the substrate 9 together with the substrate holding part 31 about the central axis J1.

The cup part 4 is an annular member around the central axis J1 and disposed outer than the substrate 9 and the substrate holding part 31 in a radial direction. The cup part 4 covers the surrounding of the substrate 9 and the substrate holding part 31 along the entire circumference and receives the processing liquid or the like spattering from the substrate 9 into the surroundings. On the bottom portion of the cup part 4, a not-shown exhaust port is provided. The processing liquid or the like received by the cup part 4 is discharged outside the cup part 4 and the housing 11 through the exhaust port.

The heating part 5 heats the substrate 9 from the side of the lower surface 92. In the exemplary case of FIG. 1, the heating part 5 is an electric heater incorporated in the substrate holding part 31. The heating part 5 may be, for example, a light emitting part disposed below the substrate holding part 31. In this case, by emitting light to the lower surface 92 of the substrate 9 from the heating part 5 through the substrate holding part 31, the substrate 9 is heated from the side of the lower surface 92. Alternatively, by emitting light to a lower surface of the substrate holding part 31 from the heating part 5 to thereby heat the substrate holding part 31, the substrate 9 may be heated from the side of the lower surface 92 by the heated substrate holding part 31.

Further, the heating part 5 may be a lower nozzle provided on an upper surface of the substrate holding part 31. In this case, by supplying a heated liquid (for example, the same liquid as the second processing liquid described later) from the heating part 5 to the lower surface 92 of the substrate 9, the substrate 9 is heated from the side of the lower surface 92. Alternatively, by injecting heated gas (for example, inert gas) from the heating part 5 toward the lower surface 92 of the substrate 9, the substrate 9 is heated from the side of the lower surface 92.

The processing liquid supply part 6 includes a first nozzle 61, a second nozzle 62, and a supply control part 63. The first nozzle 61 and the second nozzle 62 are disposed above a center portion of the substrate 9. The first nozzle 61 and the second nozzle 62 are disposed near to each other. A flow channel of the first nozzle 61 is preferably narrower than that of the second nozzle 62. A tip of the first nozzle 61 is positioned lower than that of the second nozzle 62 (in other words, positioned nearer to the upper surface 91 of the substrate 9 in the vertical direction). A discharge port for discharging the processing liquid is provided at the tip of the first nozzle 61 and the tip of the second nozzle 62, respectively.

The first nozzle 61 is connected to a first processing liquid supply source 65 through a first pipe 641. On the first pipe 641, provided is a first valve 642. The flow rate of the first processing liquid supplied to the first nozzle 61 from the first processing liquid supply source 65 through the first pipe 641 is adjusted by the first valve 642. The first nozzle 61 discharges the first processing liquid from the first processing liquid supply source 65 toward the upper surface 91 of the substrate 9.

The second nozzle 62 is connected to a second processing liquid supply source 67 through a second pipe 661. On the second pipe 661, provided is a second valve 662. The flow rate of the second processing liquid supplied to the second nozzle 62 from the second processing liquid supply source 67 through the second pipe 661 is adjusted by the second valve 662. The second nozzle 62 discharges the second processing liquid from the second processing liquid supply source 67 toward the upper surface 91 of the substrate 9.

The supply control part 63 controls the first valve 642 to switch between discharge and stop of the first processing liquid from the first nozzle 61 and to adjust the flow rate of the first processing liquid discharged from the first nozzle 61. The supply control part 63 controls the second valve 662 to switch between discharge and stop of the second processing liquid from the second nozzle 62 and to adjust the flow rate of the second processing liquid discharged from the second nozzle 62.

The first processing liquid and the second processing liquid are liquids which are different in the type from each other. The second processing liquid is a liquid having a specific gravity lower than that of the first processing liquid and a boiling point higher than that of the first processing liquid. The first processing liquid and the second processing liquid have relatively low miscibility and are hard to mix with each other. The difference in the solubility parameter (SP value) between the first processing liquid and the second processing liquid is preferably not smaller than 5, and more preferably not smaller than 10. The surface tension of the first processing liquid is preferably smaller than that of the second processing liquid.

The first processing liquid is, for example, hydrofluoroether (hereinafter, referred to as "HFE") which is one of water-insoluble fluorine-containing liquids. The second processing liquid is, for example, deionized water (DIW). The specific gravity of the HFE used as the first processing liquid is about 1.4 to 1.6, the boiling point thereof is about 35 to 75° C., and the solubility parameter thereof is about 6.0 to 6.5. The specific gravity of the deionized water used as the second processing liquid is about 1.0, the boiling point thereof is about 100° C., and the solubility parameter thereof is about 23.4. As the second processing liquid, for example, isopropyl alcohol (hereinafter, referred to as "IPA") may be used. The specific gravity of the IPA is about 0.8, the boiling point thereof is about 82° C., and the solubility parameter thereof is about 11.5.

Figure 2:
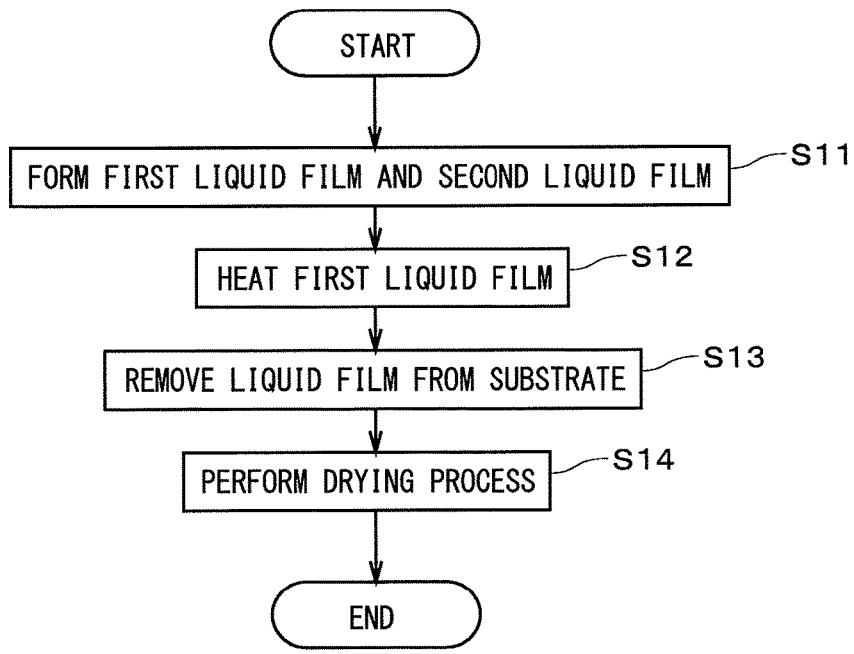
FIG. 2 is a flowchart showing an operation flow of substrate processing.
Figure 3:
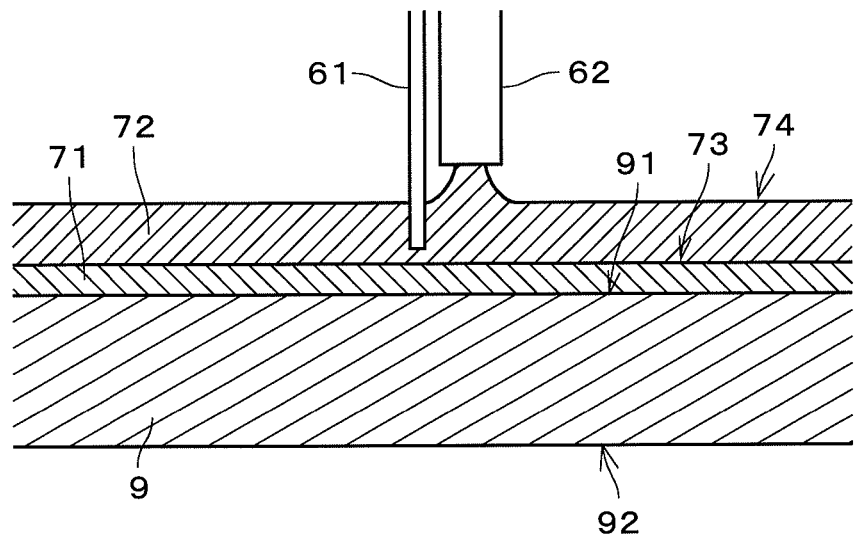
FIG. 3 is a cross section enlargedly showing a portion in the vicinity of an upper surface of a substrate.

FIG. 2 is a flowchart showing an operation flow of the processing of the substrate 9 in the substrate processing apparatus 1 shown in FIG. 1. FIG. 3 is a cross section enlargedly showing a state in the vicinity of the upper surface 91 of the substrate 9. In the substrate processing apparatus 1 of FIG. 1, first, the substrate 9 is loaded into the housing 11 and held by the substrate holding part 31.

Subsequently, the substrate rotating mechanism 33 starts rotation of the substrate 9 at a low speed (for example, about 10 rpm). Next, by the control of the supply control part 63 of the processing liquid supply part 6, the first processing liquid is supplied onto the upper surface 91 of the substrate 9 from the first nozzle 61. The first processing liquid discharged onto the center portion of the upper surface 91 of the substrate 9 from the first nozzle 61 is spread outward in the radial direction on the upper surface 91 of the substrate 9. As shown in FIG. 3, the first liquid film 71 which is a liquid film of the first processing liquid is thereby formed on the upper surface 91 of the substrate 9. In the exemplary case of FIG. 3, the first liquid film 71 entirely covers the upper surface 91 of the substrate 9. The first processing liquid reaching an outer edge of the substrate 9 drops from the outer edge into the cup part 4 and is collected or discarded. When the formation of the first liquid film 71 is finished, the supply of the first processing liquid from the first nozzle 61 is stopped.

Next, by the control of the supply control part 63 (see FIG. 1), the second liquid is supplied onto the upper surface 91 of the substrate 9 from the second nozzle 62. The second processing liquid discharged onto the center portion of the upper surface 91 of the substrate 9 from the second nozzle 62 is spread outward in the radial direction on an upper surface 73 of the first liquid film 71 since the specific gravity of the second processing liquid is lower than that of the first processing liquid. The second liquid film 72 which is a liquid film of the second processing liquid is thereby formed on the upper surface 73 of the first liquid film 71 (in Step S11). In other words, in Step S11, by the processing liquid supply part 6, the first liquid film 71 and the second liquid film 72 which covers the upper surface 73 of the first liquid film 71 are formed on the upper surface 73 of the substrate 9.

In the exemplary case of FIG. 3, the second liquid film 72 entirely covers the upper surface 73 of the first liquid film 71. In other words, the upper surface 73 of the first liquid film 71 is a lower surface of the second liquid film 72 and an interface between the first liquid film 71 and the second liquid film 72. Further, in the exemplary case of FIG. 3, the tip of the first nozzle 61 is positioned between the upper surface 91 of the substrate 9 and an upper surface 74 of the second liquid film 72 in a state where the second liquid film 72 is formed. The second processing liquid reaching the outer edge of the substrate 9 drops from the outer edge into the cup part 4 and is collected or discarded. Also after the formation of the second liquid film 72 is finished, the supply of the second processing liquid from the second nozzle 62 is not stopped and the second processing liquid is continuously supplied to the second liquid film 72 from the processing liquid supply part 6.

After the formation of the first liquid film 71 and that of the second liquid film 72 are finished, the substrate 9 is heated from the side of the lower surface 92 by the heating part 5 (see FIG. 1). The first liquid film 71 on the upper surface 91 of the substrate 9 is thereby heated from the side of the lower surface 92 of the substrate 9 (in Step S12). The first liquid film 71 is heated at a temperature (hereinafter, referred to as a "liquid film heating temperature") not lower than the boiling point of the first processing liquid and lower than the boiling point of the second processing liquid. The liquid film heating temperature is, for example, about 80° C. By heating the first liquid film 71 at the liquid film heating temperature, the first processing liquid is vaporized (in other words, boiled) inside the first liquid film 71 between the second liquid film 72 and the substrate 9. Though the second liquid film 72 in contact with the upper surface 73 of the first liquid film 71 is also heated on the substrate 9, since the liquid film heating temperature is lower than the boiling point of the second processing liquid as described above, the second processing liquid is not vaporized (in other words, not boiled) inside the second liquid film 72.

Figure 4:
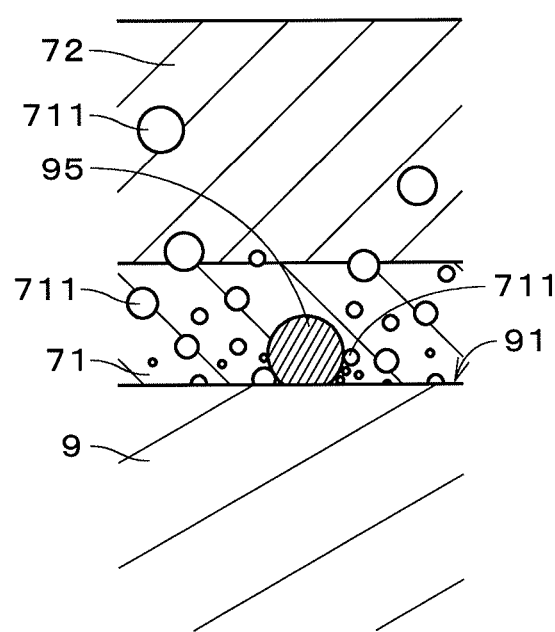
FIG. 4 is cross sections further enlargedly showing the portion in the vicinity of the upper surface of the substrate.
Figure 5:
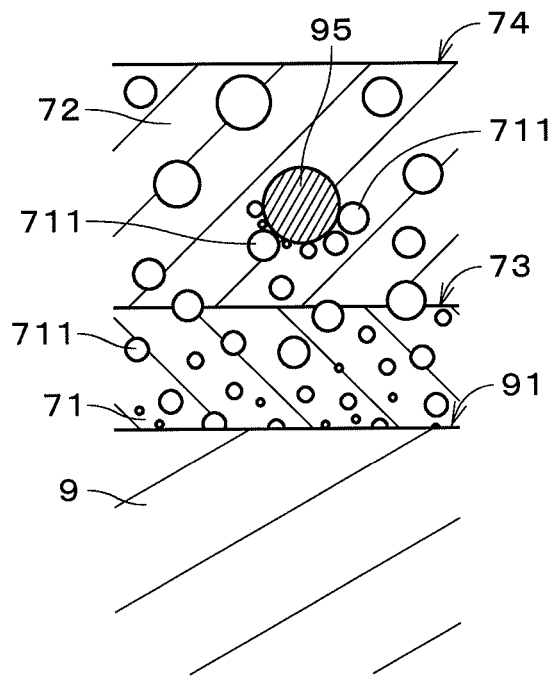
FIG. 5 is cross sections further enlargedly showing the portion in the vicinity of the upper surface of the substrate.

FIGS. 4 and 5 are cross sections further enlargedly showing the portion in the vicinity of the upper surface 91 of the substrate 9 shown in FIG. 3. As shown in FIG. 4, bubbles 711 of the first processing liquid vaporized between the second liquid film 72 and the substrate 9 are moved upward inside the first liquid film 71 by a buoyant force. At that time, the bubbles 711 adhere to the extraneous matters 95 deposited on the upper surface 91 of the substrate 9, and the extraneous matters 95 are removed from the upper surface 91 of the substrate 9 by the buoyant force acting on the bubbles 711. The extraneous matters 95 removed from the substrate 9 are moved upward inside the first liquid film 71 together with the bubbles 711 of the first processing liquid, and pass through the upper surface 73 of the first liquid film 71 and are moved into the second liquid film 72 as shown in FIG. 5. The extraneous matters 95 moved into the second liquid film 72 are held by the second liquid film 72. Further, the bubbles 711 of the first processing liquid moving into the second liquid film 72 move through the upper surface 74 of the second liquid film 72 to the outside of the second liquid film 72.

In the substrate processing apparatus 1, as described above, the processing liquid supply part 6 continuously supplies the second processing liquid to the second liquid film 72 in parallel with the vaporization of the first processing liquid in Step S12. For this reason, the extraneous matters 95 held inside the second liquid film 72 are moved outward in the radial direction, together with the second processing liquid, and removed from the substrate 9.

In the substrate processing apparatus 1, by performing the heating of the first liquid film 71 for a predetermined time, a process of removing the extraneous matters 95 is performed on the upper surface 91 of the substrate 9. After the predetermined time has elapsed, the heating of the first liquid film 71 is stopped. When the heating of the first liquid film 71 is stopped, it is preferable that the first liquid film 71 having a volume reduced by the vaporization should remain, entirely covering the upper surface 91 of the substrate 9. For this reason, it is possible to prevent the second liquid film 72 holding the extraneous matters 95 from getting into touch with the upper surface 91 of the substrate 9. As a result, it is possible to prevent the extraneous matters 95 inside the second liquid film 72 from being deposited again onto the upper surface 91 of the substrate 9.

When the heating of the first liquid film 71 is finished, the substrate rotating mechanism 33 (see FIG. 1) starts the rotation of the substrate 9 while the supply of the second processing liquid onto the substrate 9 is continued. With the rotation of the substrate 9, the first liquid film 71 and the second liquid film 72 on the substrate 9 are moved outward in the radial direction and spattered from the outer edge of the substrate 9 into the surroundings, to be thereby removed from the upper surface 91 of the substrate 9 (in Step S13). Further, the second processing liquid supplied onto the upper surface 91 of the substrate 9 from the second nozzle 62 is also spread outward in the radial direction and spattered from the outer edge of the substrate 9 into the surroundings. The first processing liquid and the second processing liquid spattering from the substrate 9 are received by the cup part 4 and discharged outside the cup part 4 and the housing 11 through the exhaust port.

In the substrate processing apparatus 1, by performing the supply of the second processing liquid and the rotation of the substrate 9 for a predetermined time, the cleaning process is performed on the upper surface 91 of the substrate 9. After the predetermined time has elapsed, the cleaning process on the substrate 9 is finished.

After the cleaning process on the substrate 9 is finished, the supply of the second processing liquid from the second nozzle 62 is stopped, and the speed of the rotation of the substrate 9 by the substrate rotating mechanism 33 increases. By rotating the substrate 9 at a relatively high speed, the second processing liquid remaining on the upper surface 91 of the substrate 9 is moved outward in the radial direction and spattered from the outer edge of the substrate 9 into the surroundings. As a result, the second processing liquid on the substrate 9 is removed (in Step S14). Hereinafter, the processing in Step S14 is referred to as a "drying process". In the drying process, the second processing liquid spattering from the substrate 9 and is received by the cup part 4 is also discharged outside the cup part 4 and the housing 11 through the exhaust port. The substrate 9 after being subjected to the drying process is unloaded from the housing 11. In the substrate processing apparatus 1, the above-described steps S11 to S14 are sequentially performed on a plurality of substrates 9.

In the substrate processing apparatus 1, as described above, the first processing liquid and the second processing liquid having a specific gravity lower than that of the first processing liquid and a boiling point higher than that of the first processing liquid are supplied onto the upper surface 91 of the substrate 9, and the first liquid film 71 which is a liquid film of the first processing liquid and the second liquid film 72 which is a liquid film of the second processing liquid and covers the upper surface 73 of the first liquid film 71 are formed on the upper surface 91 of the substrate 9 (in Step S11). Subsequently, the heating of the first liquid film 71 is performed at a temperature not lower than the boiling point of the first processing liquid and lower than the boiling point of the second processing liquid. Then, by the first processing liquid vaporized between the second liquid film 72 and the substrate 9, the extraneous matters 95 on the upper surface 91 of the substrate 9 are removed from the upper surface 91 and moved to the inside of the second liquid film 72 (in Step S12).

Thus, by removing the extraneous matters 95 from the upper surface 91 of the substrate 9 by using the bubbles 711 of the first processing liquid, it is thereby possible to suitably remove the extraneous matters 95 from the substrate 9 while suppressing any damage on the upper surface 91 of the substrate 9. For this reason, the substrate processing apparatus 1 is particularly suitable for removing the extraneous matters 95 from the upper surface 91 of the substrate 9 on which a pattern is formed in advance.

When the HFE is used as the first processing liquid and the deionized water is used as the second processing liquid, the difference in the solubility parameter between the first processing liquid and the second processing liquid is relatively large and it is thereby possible to suppress the mixture of the first processing liquid and the second processing liquid. For this reason, by the heating in Step S12, it is possible to easily vaporize only the first liquid film 71 in contact with the upper surface 91 of the substrate 9. As a result, it is possible to remove the extraneous matters 95 from the substrate 9 with high efficiency. Further, since the deionized water is used as the second processing liquid, it is possible to reduce the cost required for removing the extraneous matters 95 from the substrate 9.

Also when the HFE is used as the first processing liquid and the IPA is used as the second processing liquid, the difference in the solubility parameter between the first processing liquid and the second processing liquid is relatively large and it is thereby possible to suppress the mixture of the first processing liquid and the second processing liquid. For this reason, by the heating in Step S12, it is possible to easily vaporize only the first liquid film 71 in contact with the upper surface 91 of the substrate 9. As a result, it is possible to remove the extraneous matters 95 from the substrate 9 with high efficiency.

If only a liquid film of one type of processing liquid is formed on the upper surface 91 of the substrate 9, when it is intended to remove the extraneous matters by heating the liquid film to a temperature not lower than the boiling point of the processing liquid and vaporizing the processing liquid, there is a possibility that the liquid film may be vaporized excessively quickly to disappear from the upper surface 91 of the substrate 9 and the extraneous matters removed from the upper surface 91 of the substrate 9 may be deposited again on the upper surface 91 of the substrate 9. On the other hand, when it is intended to vaporize the liquid film lest the liquid film disappears from the upper surface 91 of the substrate 9, it is necessary to control the heating of the liquid film with high accuracy. Further, though there is a possible case where the liquid film is heated and vaporized while the supply of the processing liquid continues, similarly to the above, it is necessary to control the heating of the liquid film and the supply of the processing liquid with high accuracy lest the liquid film is vaporized excessively quickly to disappear, even if partially, from the upper surface 91 of the substrate 9. Further, in a case where the processing liquid to be vaporized is expensive, the cost required for removing the extraneous matters increases when the liquid film is vaporized while the supply of the processing liquid continues.

On the other hand, in the substrate processing apparatus 1, since the upper surface 73 of the first liquid film 71 is covered with the second liquid film 72 having a boiling point higher than the liquid film heating temperature as described above, there is no possibility that the upper surface 91 of the substrate 9 may be exposed even if the first liquid film 71 is vaporized to disappear. Therefore, since it is not necessary to control the heating of the first liquid film 71 with high accuracy, it is possible to easily remove the extraneous matters 95 from the substrate 9.

In the substrate processing apparatus 1, as described above, by heating the substrate 9 from the side of the lower surface 92 by using the heating part 5, the heating of the first liquid film 71 in Step S12 is performed. An upflow of the first processing liquid is thereby formed inside the first liquid film 71. As a result, since the extraneous matters 95 become easier to be removed upward from the upper surface 91 of the substrate 9, it is possible to more suitably remove the extraneous matters 95 from the substrate 9. Further, it is possible to easily move the extraneous matters 95 removed from the upper surface 91 of the substrate 9 toward the second liquid film 72 positioned above the first liquid film 71.

In the substrate processing apparatus 1, as described above, the second processing liquid is continuously supplied onto the second liquid film 72 in parallel with the vaporization of the first processing liquid and the move of the extraneous matters 95 to the second liquid film 72 in Step S12. It is thereby possible to quickly move the extraneous matters 95 removed from the substrate 9 and held inside the second liquid film 72, outward in the radial direction together with the second processing liquid, and to quickly remove the extraneous matters 95 from the substrate 9 in parallel with the heating of the first liquid film 71.

In the substrate processing apparatus 1, the first processing liquid may be also continuously supplied onto the first liquid film 71 in parallel with Step S12. It is thereby possible to prevent the first liquid film 71 from being vaporized to disappear altogether during the heating of the first liquid film 71 for the predetermined time. In this case, since the tip of the first nozzle 61 is positioned between the upper surface 91 of the substrate 9 and the upper surface 74 of the second liquid film 72 in the state where the second liquid film 72 is formed, it is possible to easily supply the first processing liquid onto the first liquid film 71 covered with the second liquid film 72.

In the substrate processing apparatus 1, after the vaporization of the first processing liquid and the move of the extraneous matters 95 to the second liquid film 72 in Step S12, by rotating the substrate 9, the second liquid film 72 is removed from the upper surface 91 of the substrate 9 (in Step S13). It is thereby possible to easily remove the second liquid film 72 holding the extraneous matters 95 from the substrate 9 and easily complete the cleaning process of the substrate 9.

As described above, the first liquid film 71 entirely covers the upper surface 91 of the substrate 9 and the second liquid film 72 entirely covers the upper surface 73 of the first liquid film 71. It is thereby possible to uniformly clean the entire upper surface 91 of the substrate 9. In the substrate processing apparatus 1, when it is intended to partially clean part of the upper surface 91 of the substrate 9, the first liquid film 71 partially covering only a portion of the upper surface 91 to be cleaned and the second liquid film 72 covering the first liquid film 71 may be formed. Then, by heating the first liquid film 71 to the liquid film heating temperature, the extraneous matters 95 at the portion to be cleaned on the upper surface 91 of the substrate 9 are removed from the upper surface 91 in the same manner as above.

The formation of the first liquid film 71 and that of the second liquid film 72 in Step S11 may be performed while the substrate rotating mechanism 33 rotates the substrate 9 at a relatively low speed. The first processing liquid on the substrate 9 and the second processing liquid on the first liquid film 71 are thereby quickly spread outward in the radial direction. As a result, it is possible to reduce the time required for forming the first liquid film 71 and the second liquid film 72. Further, the heating of the first liquid film 71 in Step S12 may be also performed while the substrate 9 is rotated at a relatively low speed. It is thereby possible to almost uniformly heat the entire first liquid film 71.

In Step S11, the supply of the second processing liquid may be started before the first liquid film 71 entirely covers the upper surface 91 of the substrate 9. Since the surface tension of the first processing liquid is smaller than that of the second processing liquid as described above, the first processing liquid is spread on the upper surface 91 of the substrate 9 more quickly than the second processing liquid and entirely covers the upper surface 91 of the substrate 9 earlier than the second processing liquid. It is thereby possible to reduce the time required for forming the first liquid film 71 and the second liquid film 72 on the substrate 9.

In Step S11, the second liquid film 72 may be formed before the first processing liquid is supplied onto the substrate 9. In the substrate processing apparatus 1, as described above, the tip of the first nozzle 61 is positioned between the upper surface 91 of the substrate 9 and the upper surface 74 of the second liquid film 72 in the state where the second liquid film 72 is formed, in other words, in the state before the first processing liquid is supplied. For this reason, the first processing liquid discharged from the first nozzle 61 easily passes through the second liquid film 72 and reaches the upper surface 91 of the substrate 9, and is spread outward in the radial direction along the upper surface 91 of the substrate 9. As a result, even when the first processing liquid is supplied after the second liquid film 72 is formed, it is possible to easily form the first liquid film 71 between the substrate 9 and the second liquid film 72.

Further, in the substrate processing apparatus 1, the supply of the first processing liquid and the supply of the second processing liquid may be started at the same time, and the formation of the first liquid film 71 and the formation of the second liquid film 72 may be performed in parallel. It is thereby possible to complete the formation of the first liquid film 71 and that of the second liquid film 72 in a short time. Also in this case, since the tip of the first nozzle 61 is positioned between the upper surface 91 of the substrate 9 and the upper surface 74 of the second liquid film 72 in the state where the second liquid film 72 is formed, it is possible to easily form the first liquid film 71 between the substrate 9 and the second liquid film 72.

Thus, in the substrate processing apparatus 1, the formation of the first liquid film 71 may be performed before or after, or in parallel with the formation of the second liquid film 72 in Step S11. In the substrate processing apparatus 1, since the tip of the first nozzle 61 is positioned between the upper surface 91 of the substrate 9 and the upper surface 74 of the second liquid film 72 in the state where the second liquid film 72 is formed, it is possible to easily form the first liquid film 71 and the second liquid film 72 regardless of the order of formation of the first liquid film 71 and the second liquid film 72.

Figure 6:
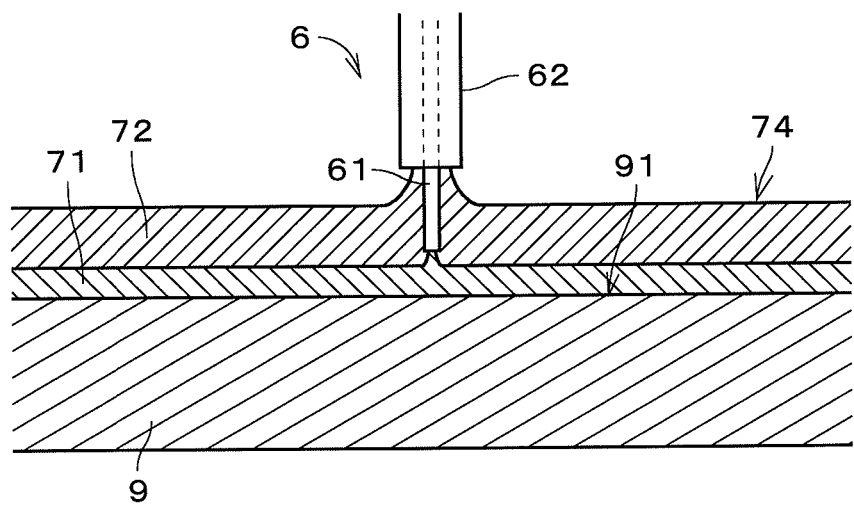
FIG. 6 is a view showing another structure of a first nozzle and a second nozzle.

FIG. 6 is a view showing another preferred structure of the processing liquid supply part 6. In the exemplary case of FIG. 6, the first nozzle 61 and the second nozzle 62 serve as a double nozzle. Specifically, the first nozzle 61 is disposed inside a flow channel of the second nozzle 62, and the second processing liquid is discharged along the first nozzle 61 from the surrounding of the first nozzle 61. Also in the exemplary case of FIG. 6, the first nozzle 61 and the second nozzle 62 are disposed above the center portion of the substrate 9 and the tip of the first nozzle 61 is positioned below the tip of the second nozzle 62. In the substrate processing apparatus 1, even in a case where the first nozzle 61 and the second nozzle 62 shown in FIG. 6 are provided, the tip of the first nozzle 61 is positioned between the upper surface 91 of the substrate 9 and the upper surface 74 of the second liquid film 72 in the state where the second liquid film 72 is formed. It is thereby possible to easily form the first liquid film 71 and the second liquid film 72 regardless of the order of formation of the first liquid film 71 and the second liquid film 72. Further, FIG. 6 shows a case where the supply of the first processing liquid from the first nozzle 61 and the supply of the second processing liquid from the second nozzle 62 are performed in parallel and the first liquid film 71 and the second liquid film 72 are formed in parallel.

Figure 7:
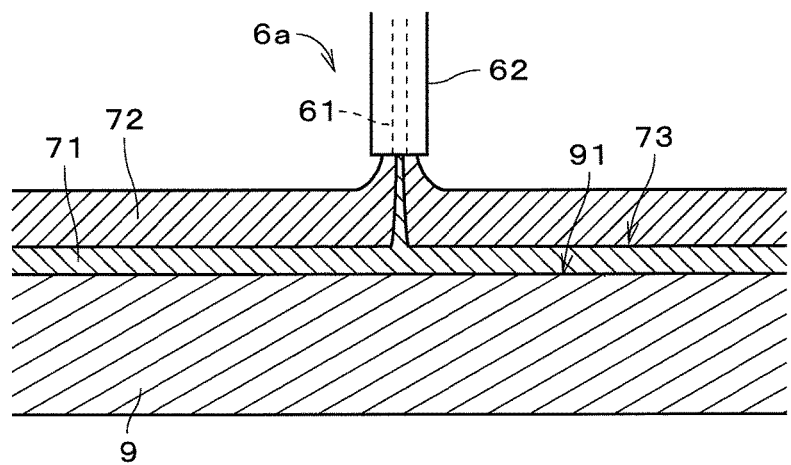
FIG. 7 is a view showing still another processing liquid supply part.

FIG. 7 is a view showing still another preferred processing liquid supply part. In a processing liquid supply part 6a of FIG. 7, the first nozzle 61 and the second nozzle 62 serve as a double nozzle, and the tip of the first nozzle 61 and that of the second nozzle 62 are positioned at almost the same level in the vertical direction. In the processing liquid supply part 6a, by starting the discharge of the first processing liquid and that of the second processing liquid at the same time in Step S11, the formation of the first liquid film 71 on the upper surface 91 of the substrate 9 and the formation of the second liquid film 72 on the upper surface 73 of the first liquid film 71 are performed in parallel. It is thereby possible to complete the formation of the first liquid film 71 and the second liquid film 72 in a short time.

In the processing liquid supply part 6a, the first nozzle 61 is disposed inside the flow channel of the second nozzle 62, and the second processing liquid is discharged along the first nozzle 61 from the surrounding of the first nozzle 61. For this reason, the first processing liquid discharged from the first nozzle 61 can easily reach the upper surface 91 of the substrate 9 without being blocked by the second processing liquid. As a result, it is possible to easily form the first liquid film 71. In the processing liquid supply part 6a, the discharge of the second processing liquid may be started after the first liquid film 71 is formed earlier.

Figure 8:
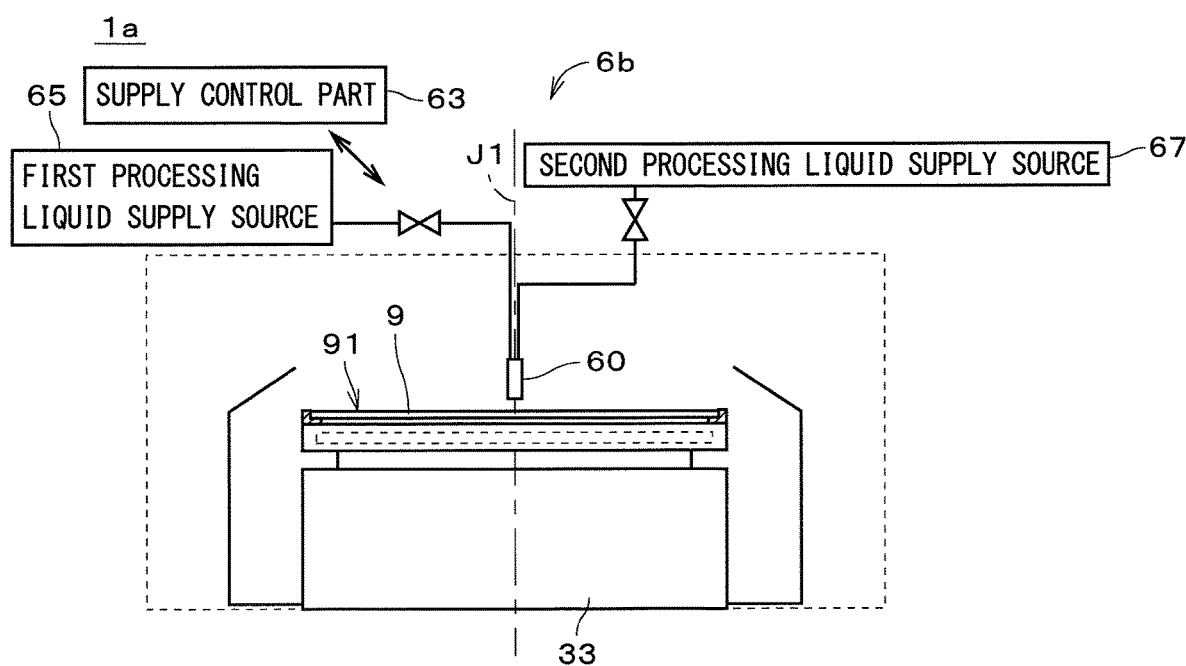
FIG. 8 is a view showing a configuration of a substrate processing apparatus in accordance with a second preferred embodiment.

FIG. 8 is a view showing a configuration of a substrate processing apparatus 1a in accordance with the second preferred embodiment of the present invention. The substrate processing apparatus 1a has almost the same configuration as that of the substrate processing apparatus 1 shown in FIG. 1 except that a processing liquid supply part 6b includes one nozzle 60, instead of the first nozzle 61 and the second nozzle 62 of FIG. 1. In the following description, constituent elements of the substrate processing apparatus 1a, which correspond to the constituent elements of the substrate processing apparatus 1, are represented by the same reference signs.

In the substrate processing apparatus 1a of FIG. 8, the nozzle 60 is connected to the first processing liquid supply source 65 and the second processing liquid supply source 67. The nozzle 60 selectively discharges the first processing liquid or the second processing liquid toward the center portion of the upper surface 91 of the substrate 9.

When the substrate 9 is processed in the substrate processing apparatus 1a, first, the first processing liquid is supplied onto the upper surface 91 of the substrate 9 from the nozzle 60 and the first liquid film 71 (see FIG. 3) is thereby formed on the upper surface 91 of the substrate 9. Subsequently, the discharge of the first processing liquid from the nozzle 60 is stopped and the discharge of the second processing liquid is started. Then, the second processing liquid is supplied onto the upper surface 73 of the first liquid film 71 from the nozzle 60 and the second liquid film 72 is thereby formed on the upper surface 73 of the first liquid film 71 (in Step S11 of FIG. 2). When the first liquid film 71 and the second liquid film 72 are formed, the substrate rotating mechanism 33 does not rotate the substrate 9. Alternatively, the first liquid film 71 and the second liquid film 72 are sequentially formed while the substrate 9 is rotated at a relatively low speed.

The operation flow of the processing of the substrate 9 after Step S11 in the substrate processing apparatus 1a is the same as the above-described flow of Steps S12 to S14. In Step S12, the heating of the first liquid film 71 is performed at the liquid film heating temperature which is a temperature not lower than the boiling point of the first processing liquid and lower than the boiling point of the second processing liquid. Then, by the first processing liquid vaporized between the second liquid film 72 and the substrate 9, the extraneous matters 95 on the upper surface 91 of the substrate 9 (see FIGS. 4 and 5) are removed from the upper surface 91 and moved to the inside of the second liquid film 72. It is thereby possible to suitably remove the extraneous matters 95 from the substrate 9 while suppressing any damage on the upper surface 91 of the substrate 9, like in the above-described preferred embodiment.

Figure 9:
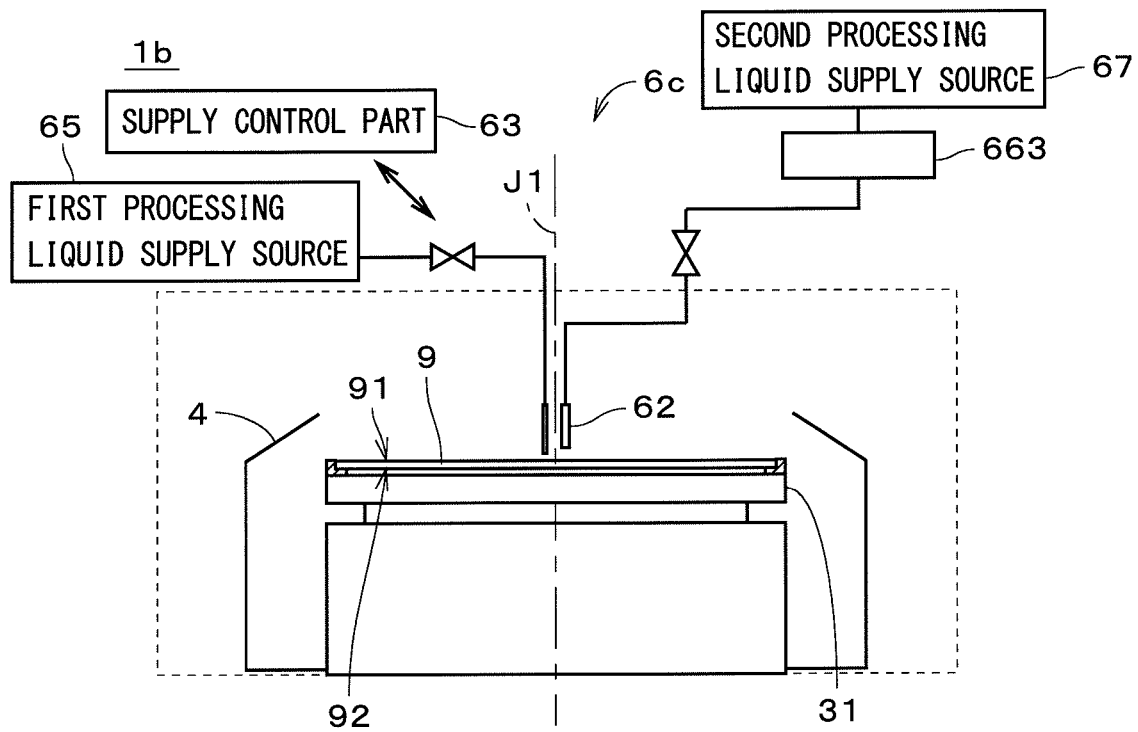
FIG. 9 is a view showing a configuration of a substrate processing apparatus in accordance with a third preferred embodiment.

FIG. 9 is a view showing a configuration of a substrate processing apparatus 1b in accordance with the third preferred embodiment of the present invention. The substrate processing apparatus 1b has almost the same configuration as that of the substrate processing apparatus 1 shown in FIG. 1 except that the heating part 5 below the substrate 9 is omitted and a processing liquid supply part 6c is provided with a processing liquid heating part 663 for heating the second processing liquid. In the following description, constituent elements of the substrate processing apparatus 1b, which correspond to the constituent elements of the substrate processing apparatus 1, are represented by the same reference signs.

In the substrate processing apparatus 1b, in Step S11, the first liquid film 71 (see FIG. 3) is formed on the upper surface 91 of the substrate 9, like in the substrate processing apparatus 1. After that, the second processing liquid heated by the processing liquid heating part 663 is supplied onto the upper surface 73 of the first liquid film 71 on the substrate 9 from the second nozzle 62. By using the processing liquid heating part 663, the second processing liquid is heated to a temperature higher than the above-described liquid film heating temperature (naturally higher than the boiling point of the first processing liquid) and lower than the boiling point of the second processing liquid.

In the substrate processing apparatus 1b, in parallel with the formation of the second liquid film 72 by using the second processing liquid (Step S11), the heating of the first liquid film 71 is performed by using the second liquid film 72 heated by the processing liquid heating part 663 and the first liquid film 71 is heated to the liquid film heating temperature. Then, the extraneous matters 95 (see FIGS. 4 and 5) on the upper surface 91 of the substrate 9 are removed from the upper surface 91 and moved to the second liquid film 72 (in Step S12) by using the first processing liquid vaporized between the second liquid film 72 and the substrate 9. It is thereby possible to suitably remove the extraneous matters 95 from the substrate 9 while suppressing any damage on the upper surface 91 of the substrate 9, like in the above-described preferred embodiments.

Further, since it is not necessary to provide any heating part for heating the substrate 9 from the side of the lower surface 92 inside or in the vicinity of the substrate holding part 31 in the substrate processing apparatus 1b, it is possible to simplify the structure of the substrate holding part 31 or the neighborhood of the substrate holding part 31.

In the substrate processing apparatus 1b, like in the substrate processing apparatus 1 shown in FIG. 1, the supply of the second processing liquid may be started before the first liquid film 71 entirely covers the upper surface 91 of the substrate 9 in Step S11. Further, in Step S11, the second liquid film 72 may be formed before the first processing liquid is supplied onto the substrate 9. Furthermore, in Step S11, the supply of the first processing liquid and the supply of the second processing liquid may be started at the same time and the formation of the first liquid film 71 and the formation of the second liquid film 72 may be performed in parallel.

In the above-described substrate processing apparatuses 1, 1a, and 1b, various modifications can be made.

In the above-described step S12, for example, the heating of the first liquid film 71 may be performed until the first liquid film 71 is vaporized to disappear between the substrate 9 and the second liquid film 72.

In the substrate processing apparatus 1 of FIG. 1, the heating part 5 may be, for example, a light emitting part disposed above the substrate holding part 31. In this case, by emitting light onto the second liquid film 72 from the heating part 5, the first liquid film 71 is heated to the liquid film heating temperature through the second liquid film 72.

Further, the heating part 5 may be a gas supply part which is disposed above the substrate holding part 31 and supplies heated gas (for example, inert gas) onto the second liquid film 72. Also in this case, the first liquid film 71 is heated to the liquid film heating temperature by the heated gas from the heating part 5 through the second liquid film 72. The same applies to the substrate processing apparatus 1a shown in FIG. 8.

In the substrate processing apparatus 1b of FIG. 9, in addition to the processing liquid heating part 663, the heating part 5 (see FIG. 1) for heating the first liquid film 71 from the side of the lower surface 92 of the substrate 9 may be also provided. It is thereby possible to quickly heat the first liquid film 71.

Though the first processing liquid and the second processing liquid are supplied onto the substrate 9, not being mixed, in the substrate processing apparatuses 1, 1a, and 1b, a mixed solution of the first processing liquid and the second processing liquid may be supplied onto the substrate 9. In this case, in the mixed solution supplied onto the substrate 9, the first processing liquid is sunken onto the upper surface 91 of the substrate 9 and separated from the second processing liquid due to the difference in the specific gravity, and the first liquid film 71 and the second liquid film 72 are thereby formed. As the mixed solution, for example, used is a solution obtained by removing the extraneous matters, through a filter or the like, from the mixed solution of the first processing liquid which is used for the above-described extraneous matter removing process on the other substrate 9 and collected and the second processing liquid.

On the upper surface 91 of the substrate 9, a liquid film of another processing liquid different from the first processing liquid or the second processing liquid may be formed on the upper surface 74 of the second liquid film 72 or between the second liquid film 72 and the first liquid film 71.

Figure 10:
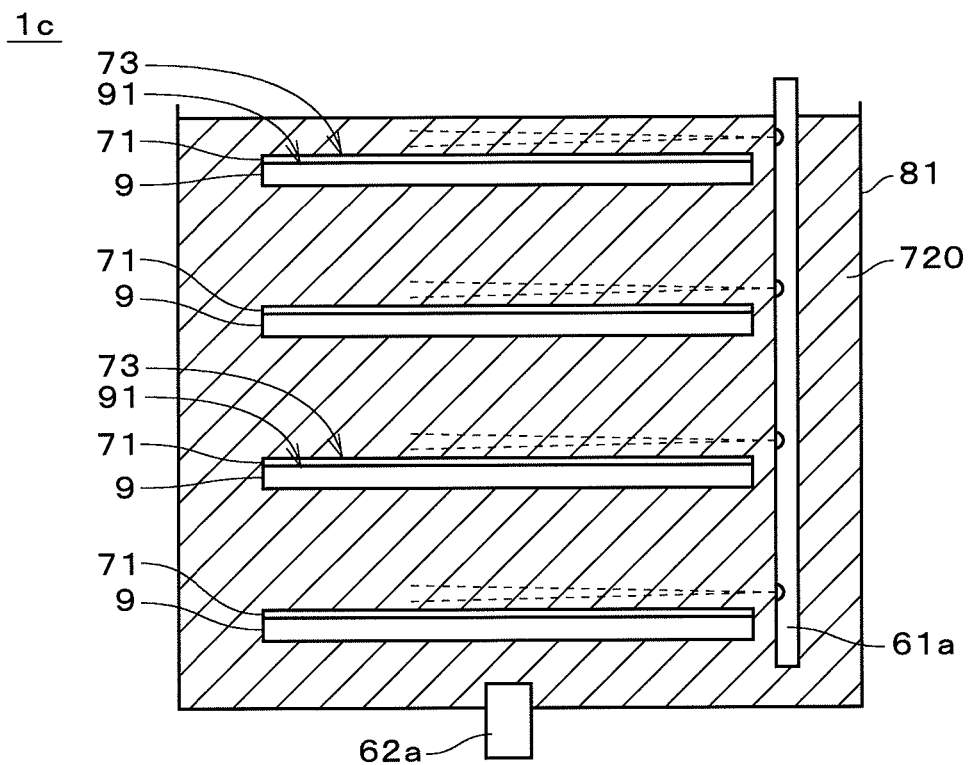
FIG. 10 is a view showing a configuration of another substrate processing apparatus.

FIG. 10 is a view showing a configuration of another preferred substrate processing apparatus 1c. The substrate processing apparatus 1c is a batch type apparatus which performs substantially the same extraneous matter removing process as described above, on a plurality of substrates 9 in parallel. The substrate processing apparatus 1c includes a pooling bath 81, a first nozzle 61a, and a second nozzle 62a. The second nozzle 62a supplies the second processing liquid (for example, DIW or IPA) from a bottom portion of the pooling bath 81 to the inside of the pooling bath 81. The second processing liquid from the second nozzle 62a is pooled in the pooling bath 81. The plurality of substrates 9 are held by a not-shown holding part, with the respective upper surfaces 91 facing upward, and are immersed into a second processing liquid 720 inside the pooling bath 81.

The first nozzle 61a is disposed at a side of the plurality of substrates 9 and discharges the first processing liquid (for example, HFE) from a plurality of discharge ports toward above the respective upper surfaces 91 of the plurality of substrates 9. Since the first processing liquid discharged toward above the upper surface 91 of each substrate 9 has a specific gravity higher than that of the second processing liquid 720, the first processing liquid is sunken in the second processing liquid 720 and spread on the upper surface 91 of each substrate 9. The first liquid film 71 which entirely covers the upper surface 91 of each substrate 9 is thereby formed. Paying attention to a region immediately above the upper surface 91 of each substrate 9, the first liquid film 71 which entirely covers the upper surface 91 of the substrate 9 is formed on each substrate 9, and the second liquid film which entirely covers the upper surface 73 of the first liquid film 71 is formed on the first liquid film 71.

Subsequently, the first liquid film 71 on each substrate 9 is heated to the above-described liquid film heating temperature. Then, by the first processing liquid vaporized between the above second liquid film and each substrate 9, the extraneous matters on the upper surface 91 of the substrate 9 are removed from the upper surface 91 and moved to the inside of the second liquid film (in other words, the inside of the second processing liquid 720) and are held by the second processing liquid 720. It is thereby possible to suitably remove the extraneous matters from the substrate 9 while suppressing any damage on the upper surface 91 of the substrate 9, like in the above-described preferred embodiments.

The heating of the first liquid film 71 may be performed, for example, by a heater provided in the above-described holding part for holding the plurality of substrates 9, or by emitting light to each substrate 9. Alternatively, the heating of the second processing liquid 720 may be performed so that the temperature of the second processing liquid 720 in the pooling bath 81 may become higher than the liquid film heating temperature. In the substrate processing apparatus 1c, by further supplying the second processing liquid into the pooling bath 81 from the second nozzle 62a, the second processing liquid holding the extraneous matters overflows from an upper end portion of the pooling bath 81 and is discarded.

In the above-described substrate processing apparatuses 1 and 1a to 1c, the first processing liquid and the second processing liquid may be changed to various processing liquids. When the second processing liquid is deionized water, for example, the first processing liquid may be a liquid having a specific gravity lower than that of the deionized water and a boiling point lower than that of the deionized water, such as carbon tetra chloride, chloroform, dichloromethane, 1,2-dichloroethane, carbon disulfide, 1,1,1-trichloroethane, or the like.

The above-described substrate processing apparatuses 1 and 1a to 1c may be used for processing a glass substrate used in a display device such as a liquid crystal display, a plasma display, an FED (Field Emission Display), and the like, other than the semiconductor substrate. Alternatively, the substrate processing apparatuses 1 and 1a to 1c may be used for processing a substrate for optical disk, a substrate for magnetic disk, a substrate for magneto-optic disk, a substrate for photomask, a ceramic substrate, a substrate for solar battery, and the like. Further, though the substrate 9 is rotated at a low speed at a stage when the first liquid film and the second liquid film are formed in Step S11 in the above-described preferred embodiments, the substrate 9 may be stopped at this stage.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST 1, 1a to 1c Substrate processing apparatus
5 Heating part
6, 6a to 6c Processing liquid supply part
9 Substrate
31 Substrate holding part
33 Substrate rotating mechanism
61, 61a First nozzle
62, 62a Second nozzle
71 First liquid film
72 Second liquid film
73 Upper surface (of first liquid film)
91 Upper surface (of substrate)
92 Lower surface (of substrate)
95 Extraneous matter
J1 Central axis
S11 to S14 Steps

The invention claimed is:

1. A substrate processing method for processing a substrate, comprising:
   a) supplying a first processing liquid onto an upper surface of a substrate held in a horizontal state and a second processing liquid having a specific gravity lower than that of said first processing liquid and a boiling point higher than that of said first processing liquid, for forming a first liquid film which is a liquid film of said first processing liquid on said upper surface of said substrate, and a second liquid film which is a liquid film of said second processing liquid and which covers an upper surface of said first liquid film; and
   b) removing extraneous matters on said upper surface of said substrate from said upper surface of said substrate and moving said extraneous matters toward the inside of said second liquid film by vaporizing said first processing liquid between said second liquid film and said substrate while maintaining the state where said upper surface of said first liquid film is covered with said second liquid film, by performing heating of said first liquid film at a temperature that is not lower than the boiling point of said first processing liquid and that is lower than the boiling point of said second processing liquid.

2. The substrate processing method according to claim 1, further comprising:
   rotating said substrate about a central axis directed in a vertical direction, to thereby remove said second liquid film from said upper surface of said substrate, after said operation b).

3. The substrate processing method according to claim 1, wherein
   said second processing liquid is continuously supplied to said second liquid film in parallel with said operation b).

4. The substrate processing method according to claim 1, wherein
   said first processing liquid is continuously supplied to said first liquid film in parallel with said operation b).

5. The substrate processing method according to claim 1, wherein
   said heating of said first liquid film is performed by heating said substrate from a lower surface side in said operation b).

6. The substrate processing method according to claim 1, wherein
   said heating of said first liquid film is performed by said second processing liquid supplied onto said substrate at a temperature higher than the boiling point of said first processing liquid and lower than the boiling point of said second processing liquid in said operation b).

7. The substrate processing method according to claim 1, wherein
   said first liquid film entirely covers said upper surface of said substrate, and said second liquid film entirely covers said upper surface of said first liquid film.

8. The substrate processing method according to claim 1, wherein
said first processing liquid is hydrofluoroether and said second processing liquid is deionized water.

9. The substrate processing method according to claim 1, wherein
said first processing liquid is hydrofluoroether and said second processing liquid is isopropyl alcohol.

* * * * *